United States Patent

Flamm et al.

Patent Number: 5,181,115
Date of Patent: Jan. 19, 1993

[54] DIGITAL PHASE-LOCKED LOOP

[75] Inventors: Peter Flamm, March; Martin Winterer; Hans-Juergen Desor, both of Gundelfingen, all of Fed. Rep. of Germany

[73] Assignee: Deutsche ITT Industries GmbH, Freiburg, Fed. Rep. of Germany

[21] Appl. No.: 718,740

[22] Filed: Jun. 21, 1991

[30] Foreign Application Priority Data

Jun. 30, 1990 [EP] European Pat. Off. ............ 90112531

[51] Int. Cl.$^5$ .............................................. H04N 5/04
[52] U.S. Cl. .................................... 358/158; 358/148
[58] Field of Search ............... 358/149, 158, 148, 153, 358/159; 331/20, 25

[56] References Cited

U.S. PATENT DOCUMENTS

| | | |
|---|---|---|
| 4,330,791 | 5/1982 | Ohara et al. ............................ 358/8 |
| 4,689,664 | 8/1987 | Moring et al. ........................ 358/23 |
| 4,791,488 | 12/1988 | Fukazawa et al. .................. 358/149 |
| 4,802,009 | 1/1989 | Hartmeier ...................... 358/140 X |
| 4,858,008 | 8/1989 | Sieben et al. ........................ 358/148 |
| 4,884,040 | 11/1989 | Fling ................................ 358/158 X |

FOREIGN PATENT DOCUMENTS 0062541 4/1982 European Pat. Off. .
0239412 3/1987 European Pat. Off. .
0239413 3/1987 European Pat. Off. .

Primary Examiner—Victor R. Kostak
Attorney, Agent, or Firm—Thomas L. Peterson

[57] ABSTRACT

A digital phase-locked loop has a periodically overflowing digital oscillator (DCO), implemented as a modulo adder, and a processor device. The processor device adjusts the period T of the digital oscillator to a nominal period, determined from periodically occurring synchronizing pulses, by comparing the actual phase of the digital oscillator with a set phase at the control clock rate of the periodic synchronizing pulses. After the digital oscillator has been locked to the nominal period, the processor device compares the phases by using a double-frequency signal sequence of one-half line period derived from the digital oscillator output signal. The DCO output signal is fed to a correction device where an address-phase signal, locked to the DCO output signal, is generated so that when a non-periodic synchronizing pulse occurs, the address-phase signal is shifted by one period of the signal sequence of one-half line period with respect to the digital oscillator output signal.

14 Claims, 3 Drawing Sheets

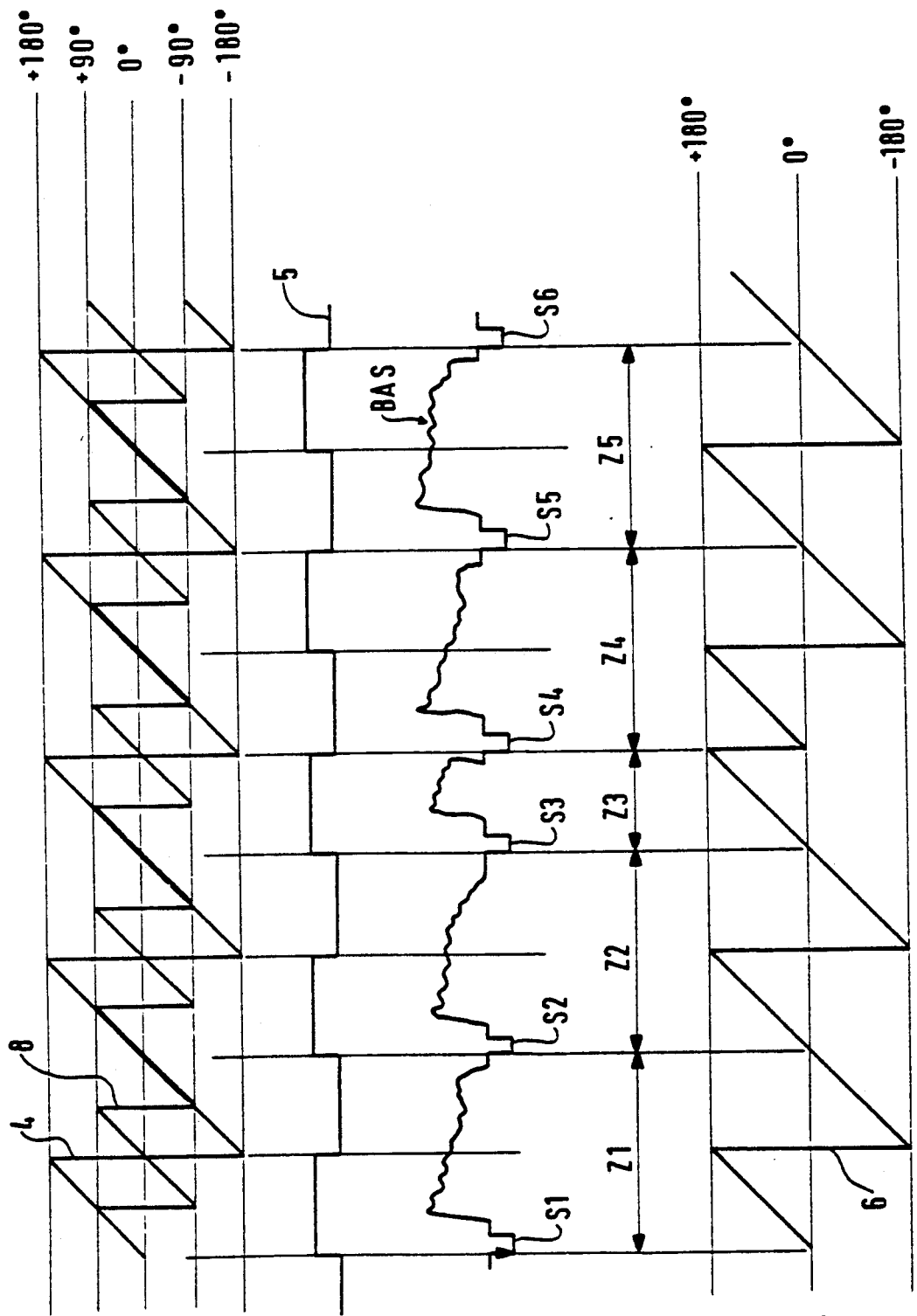

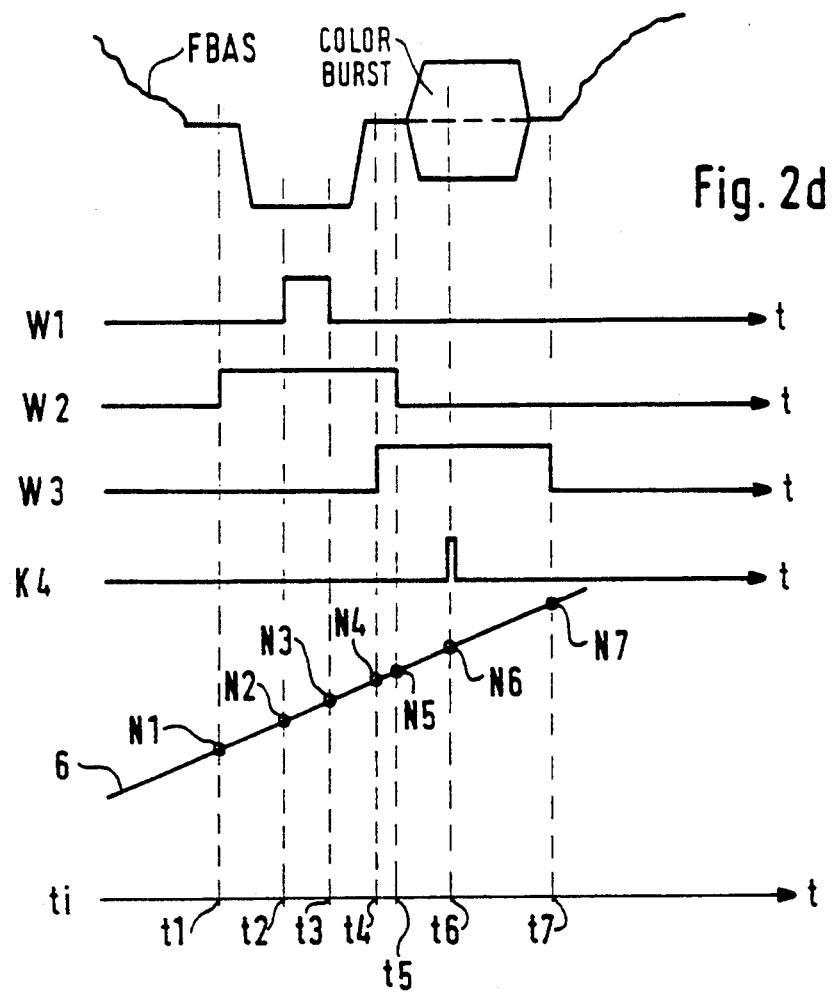
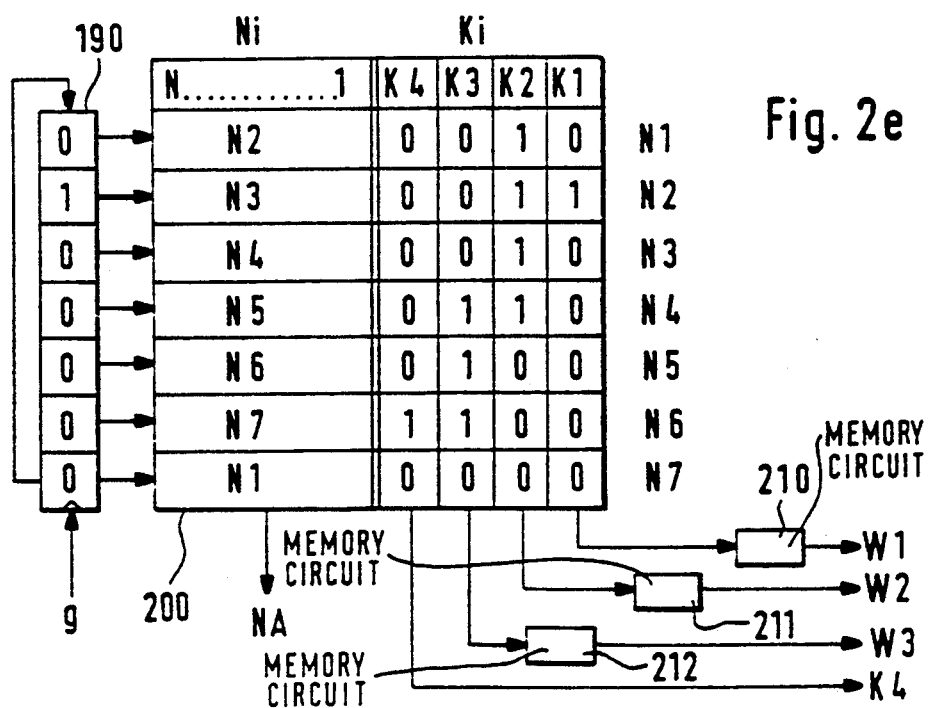

DIGITAL PHASE-LOCKED LOOP

BACKGROUND OF THE INVENTION

The present invention relates to phase-locked loops in general and more particularly to a digital phase-locked loop (DPLL).

The conventional digital phase-locked loop has a digital oscillator which generates an output signal of period T, representing the actual phase of the digital oscillator. By increasing a register word of length N successively at a predetermined clock rate of a clock generator according to a control word applied to a control input of the digital oscillator, the oscillator is caused to periodically overflow. A processor device, which is supplied with the digital oscillator output signal, adjusts the period T of the digital oscillator to a nominal period. The nominal period is determined by periodically occurring synchronizing pulses. The processor device performs a phase comparison between the actual phase of the digital oscillator and a reference phase, so that the processor device can form a phase-difference signal from the actual phase of the digital oscillator and the reference phase. This is done at a first control clock rate, which is determined by the periodically occurring synchronizing pulses. The phase-difference signal is filtered via a loop filter of the processor device, whereby, the filtered phase-differential signal is added to a frequency word whose numerical value represents the nominal period as a function of the length N of the register word (of the digital oscillator) and the predetermined clock rate (of the clock generator). During successive accumulation of the register word by the frequency word, the digital oscillator overflows in the nominal period. The control word formed from the frequency word and the phase-difference signal is then applied to the input of the digital oscillator to control the same.

Such a digital phase-locked loop (DPLL) is known in the art. It is used particularly in the horizontal deflection circuit of a television receiver to generate the horizontal frequency. For example, see U.S. Pat. No. 4,330,791, entitled "System for Processing Television Video Signals Reproduced from a Recording Medium in Special Reproduction Mode into Signals for Performing Normal Interlacing", which issued to T. Ohara, et al. on May 18, 1982 and U.S. Pat. No. 4,689,664, entitled "Circuit Arrangement for Deriving Digital Color Signals from an Analog Television Signal", which issued to W. Moring, et al. on Aug. 25, 1987. See also the European Patent Application Publication Nos. 0 62 541, 0 239 412 and 0 239 413.

In a television receiver the frequency or period of the digital oscillator must be adjusted to a nominal frequency or nominal period, respectively, which is determined by the line-periodic synchronizing pulses identifying the beginning of each line of the television picture. These line-periodic synchronizing pulses are separated from the luminance signal of the composite color signal in a sync separator which is connected ahead of the digital phase-locked loop, and then passed to a comparator in the sync separator. The comparator triggers the processor device of the digital phase-locked loop on the trailing edge of the synchronizing pulses. At this instant of triggering, the content of the register word of the digital oscillator is stored as the actual phase of the digital oscillator. The comparison between the actual phase of the digital oscillator and the reference phase, as well as the tracking of the period of the digital oscillator, is then controlled as described above. Thus, the processor device adjusts the period T of the digital oscillator to the nominal period of the line-periodic synchronizing pulses at the control clock rate, as determined by the time sequence of the line-periodic synchronizing pulses. The result is that a single adjustment is performed per line of a television picture.

Conventional digital phase-locked loops have the disadvantage of becoming unstable if the time sequence of the line-periodic synchronizing pulses is interrupted. An example of one type of interruption is due to non-line-periodic synchronizing pulses shifted by one-half line, i.e., by 180°, with respect to the line-periodic synchronizing pulses. This one-half line shifting is caused by the standard pre- and post-equalizing pulses that occur during reproduction of every last line of a first field and every first line of a second field of an interlaced television picture. Similarly, a half-line displacement of a synchronizing pulse occurs in certain modes of a video recorder, e.g., in the search mode. That is, the locking of the digital oscillator to the horizontal frequency is disturbed by the non-line-periodic synchronizing pulses. Since in conventional digital phase-locked loops all synchronizing pulses applied to the DPLL, including the non-line-periodic pulses, initiate the phase adjustment a sync problem arises. The processor device, designed to operate with a line-periodic clock signal, is unable to distinguish the non-line-periodic synchronizing pulses from the line-periodic pulses and, therefore, unnecessarily readjusts the digital oscillator. This unnecessary readjustment adversely affects the stability of the DPLL when locking the digital oscillator to the nominal period, since the digital phase-locked loop must readjust the digital oscillator to the nominal period after each non-line-periodic synchronizing pulse has entered into the phase control.

Besides influencing the horizontal deflection unit of a television receiver, the non-line-periodic synchronizing pulses also influence the video-signal-processing operations which take place at the horizontal rate. This is because the phase of the digital oscillator is used as the address phase for controlling the time sequence of these operations. The address phase assigned to a particular video-signal-processing operation determines the instant at which this operation has to be performed within each line of the television picture. To achieve exact synchronization of these timing marks with the video signal, the digital-oscillator is phase locked to the line-periodic synchronizing pulses and used to control the video signal processing. The consequence of a non-line-periodic synchronizing pulse is that the subsequent video signal (luminance signal and chrominance signal) of the line is shifted by 180° with respect to the preceding line. Therefore, in order to correct the address of the horizontal-frequency, video-signal-processing operations, a corresponding correction of the address phase is required, i.e., the phase must be shifted by 180° with respect to the phase of the digital oscillator.

It is apparent from the foregoing that with conventional phase-locked loops, the problem is one of stability. That is the phases of the digital oscillator are not to be influenced when the non-line-periodic synchronizing pulses shift by 180°, and further the correct addressing of the horizontal-frequency, video-signal-processing operations requires that non-line-periodic synchronizing pulses do not disturb the phase of the digital oscillator to enable correct timing control of the video processing.

SUMMARY OF THE INVENTION

An object of the present invention is to provide an improved digital phase-locked loop capable of stabile operation during the occurrence of non-line-periodic synchronizing pulses. In addition, the present invention enables the digital phase-locked loop to provide correct addressing of the horizontal-frequency, video-signal-processing operations according to the phase of the digital oscillator.

The processor of the present invention generates a signal sequence of one-half line period which is locked to the digital oscillator output signal. The processor device has a period TD equal to one-half the period T of the digital oscillator output signal. In this manner, after the digital oscillator has been locked to the nominal period, the processor device can perform the phase comparison between the actual phase and reference phase with the aid of the signal sequence of one-half line period. At a second control clock rate determined by the line-periodic synchronizing pulses and a non-line periodic synchronizing pulse, the digital oscillator output signal is applied to a correction device which generates an address-phase signal that is locked to the digital oscillator output signal. In the presence of a non-periodic synchronizing pulse, the address phase of the address-phase signal is shifted by the period TD of the signal sequence of one-half line period with respect to the phase of the digital oscillator output signal.

An advantage of the invention is that the DPLL operates correctly even if the time sequence of periodic synchronizing pulses is interrupted by non-(line-)periodic synchronizing pulses which have shifted by one-half period T with respect to the (line-)periodic synchronizing pulses. Performing the phase comparison at the second control clock rate is advantageous because it ensures that the non-periodic synchronizing pulses do not interfere with the operation of the digital phase-locked loop. In addition, the non-periodic synchronizing pulses are actively included in the phase-control process, whereby the digital phase-locked loop achieves a very fast transient response.

According to the invention, two phase comparisons are performed per nominal period, i.e., per line. The digital phase-locked loop also provides a linear relationship between the reference phase and the actual phase throughout the angular range of 360°. This is because the difference between these two phases is calculated linearly over the entire period as determined by the control clock rate. Furthermore, the phase-locked loop can be employed to adjust the digital oscillator to provide nominal frequencies that are for the most part discretionary.

The correction device of the digital phase-locked loop generates an address-phase signal that is locked to the phase of the digital oscillator to enable operation with the shifted video signal in the presence of a non-periodic synchronizing pulse. This keeps the horizontal-frequency video-signal-processing operations in synchronism with the underlying video signal.

The address-phase signal generated in accordance with the invention allows a wide variety of video-signal-processing operations to be performed in any phase position, i.e., at any instant within each line of the television picture. This is desirable because it permits horizontal-synchronizing-pulse processing in a video recorder for implementing special control features, such as slow-motion and fast-motion replay, still picture or replay during runback and so on.

BRIEF DESCRIPTION OF THE DRAWINGS

FIGS. 2a-2e are a series of diagrams depicting the timing between a luminance signal and the signal sequences occurring in the digital phase-locked loop of the present invention.

DETAILED DESCRIPTION OF THE DRAWINGS

Figure 1:
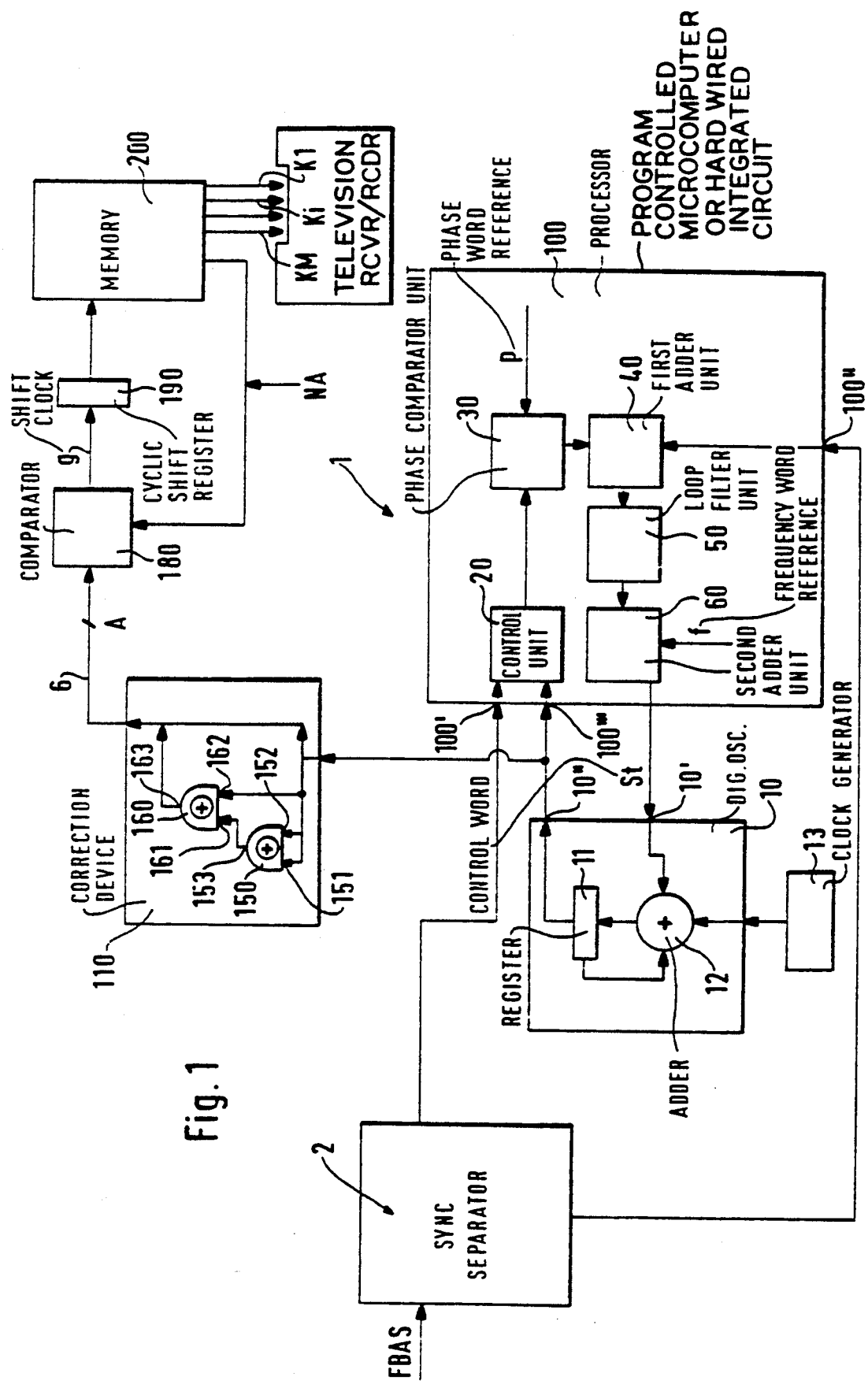
FIG. 1 shows a block diagram of a digital phase-locked loop according to the present invention.

Referring to FIGS. 1 and 2a-2e, there is shown a digital phase-locked loop 1 according to this invention. The digital phase-locked loop 1 consists of a digital oscillator 10 and a processor device 100. The processor device 100 being preceded by a sync separator 2, which serves to separate and condition the synchronizing pulses S1-S6 contained in a composite picture signal BAS (see FIG. 2b). The sync separator 2 is a well known component and is conventionally supplied with the composite picture signal FBAS, which is bandwidth limited to about 2 MHz. For an example of a typical sync separator 2 see U.S. Pat. No. 4,858,008 entitled APPARATUS FOR THE DIGITAL GENERATION OF VERTICAL SYNCHRONIZING AND FIELD IDENTIFICATION SIGNALS by U. Sieben, et al. issued on Aug. 15, 1989. This patent shows a digital sync separator whereby the circuitry utilized herein can easily be obtained from the above-noted reference, as well as that shown in U.S. Pat. No. 4,689,664. In the known sync separator 2, a Moving Time Averager (MTA) including a lowpass filter filters the signal of noise, and a comparator triggers a flip-flop on the trailing edges of the synchronizing pulses S1-S6. The output of the flip-flop is applied to a first input 100' of the processor device 100. The sync separator 2 further includes a measured-minimum memory which stores the synchronization minimum value of the composite picture signal BAS. The back porch value of the composite picture signal BAS is measured by a keyed circuit. Using these two values, a microprocessor in the sync separator 2 calculates the sync separation level and the variable for the automatic black-level control.

In addition, a phase value with an accuracy to within fractions of a clock period (skew data) is calculated by suitable techniques (e.g., linear interpolation or oversampling) at approximately the instant of separation. The output of the microprocessor is fed to a second input 100" of the processor device 100.

As a result of the separation of the synchronizing pulses S1-S6 from the composite picture signal BAS and their conditioning and splitting into the output signals of the flip-flop and the microprocessor, the two output signals of the sync separator 2, which are applied to the processor device 100, have different time resolutions. For instance, the output of the flip-flop, which is applied to the input 100', has a time accuracy of one clock period of a clock generator 13 controlling the sync separator 2 and the digital phase-locked loop 1. Consequently, this signal serves to trigger the phase adjustment and to achieve coarse control of the digital oscillator 10. A second output signal is calculated in the microprocessor of the sync separator 2 respective to the edge of the synchronizing pulses of the luminance signal BAS. The output signal contains phase information with an accuracy to within fractions of a clock period (skew data) and is used to fine-control the DPLL. Since the processor device 100 simultaneously and independently processes both of the output signals from the sync separator 2, the general term "synchronizing pulse", refers to both of the output signals from the sync separator 2.

In the embodiment shown in FIG. 1, the digital oscillator (DCO) 10 of the digital phase-locked loop 1 is designed as a periodically overflowing accumulator (modulo adder). Such an arithmetic unit consists of an accumulator register 11 and an adder 12. The accumulator register 11 stores a binary register word of length N whose current value is regarded as the binary two's-complement or sign-magnitude representation of a decimal number. Thus, the left-most bit (MSB) of the register word (—the bit N—) is used to indicate the sign, and the remaining bits, N-1, N-2 . . . , 1, are used to represent the magnitude of the decimal number. This number is contained in binary form in the accumulator register 11. The adder 12 accumulates the register word of the accumulator register 11 in a step-by-step manner at the clock rate of the clock generator 13. This is accomplished by applying a control word to the input 10' of the accumulator 10. During the continuous summation, the carry from the adder 12 is not taken into account. If the maximum range of binary values of the register word is exceeded as a result of the successive, clock-controlled accumulation in the accumulator register 11, the register word will again assume the value zero plus the overflow (low-order-digit) value. Accordingly, the output 10" of the digital oscillator 10 provides a signal (DCO output signal) as a data signal having a sawtooth waveform, as shown by reference numeral 4 in FIG. 2a. The successive accumulation of the register word by the control word st, the control word st being applied to the input 10' of the accumulator register 11, causes the value of the DCO output signal to increase step-by-step. The value increases from zero to the maximum positive value for the range of decimal values present during the first half of the digital-oscillator period T. The value then jumps from the maximum positive decimal value to the minimum negative decimal value for the range of values present during the first clock period of the second half of the digital-oscillator period T. Subsequently, and step-by-step, the value approaches the initial value of zero during the further clock periods of the second half of the digital-oscillator period T. This sawtooth-shaped DCO output signal of the digital oscillator 10 represents the phase response of the digital oscillator, which has exactly one phase value assigned to each value of the register word of the accumulator register 11. Through the implementation of the digital oscillator 10 as a periodically overflowing accumulator, a linear relationship is achieved throughout the angular range of 360° between the amplitude of the DCO output signal and the digital-oscillator phase.

The DCO output signal is applied to the processor device 100 at a third input 100'". The processor device 100 contains the functional units specified below. Preferably, the processing operations in the individual functional units are performed by a program-controlled microcomputer. The functional units represent the individual steps in a flowchart of a corresponding computer program. Alternatively, it is also possible to implement these functional units as the hard-wired logic of an integrated circuit or as discrete components, depending on the requirements of the specific application.

A control unit 20 of the processor device 100 controls the adjustment of the period T of the digital oscillator to a nominal period. This is determined by the time elapsing between two line-periodic synchronizing pulses S1 and S2. The phase adjustment is initiated by the synchronizing pulse S1, which is separated from the composite picture signal BAS by the sync separator 2, and which is applied through the first input 100' to the control unit 20. The synchronizing pulse S1 triggers the control unit 20 which then stores the instantaneous value of the DCO output signal. This value represents the actual phase of the digital oscillator 100 at this instant of triggering. This actual phase of the DCO output signal is passed to a phase comparator unit 30, where it is compared with a phase word p which represents the reference phase of the digital oscillator 10 for this instant. The phase comparator unit 30 calculates the difference between the actual phase and the reference phase to determine a phase-difference signal which is applied to a first adder unit 40. The adder unit 40 also receives the output signal (skew data) from the microprocessor in the sync separator 2. The phase-difference signal is then added to the output signal, in the first adder unit 40. The phase-difference signal is accurate to one clock period while the output signal is accurate to within fractions of a clock period. The resulting phase-difference signal is accurate to within fractions of a clock period and has a time resolution indicating the phase deviation of the digital oscillator 10.

The modified phase-difference signal is applied to a loop filter unit 50. The function of the loop filter unit 50 is to influence the dynamic properties of the phase-locked loop in a conventional manner. The filtered phase-difference signal is then fed to a second adder unit 60 where a frequency word f is applied. The value of the frequency word f is determined by the clock rate of the clock generator 13 and the length N of the register word of the accumulator register 11. That is, during successive, clock-controlled accumulation of the register word by the frequency word f, the digital oscillator 10 overflows in the nominal period. The phase word p and the frequency word f are stored as data words in a typical memory such as a ROM (not shown). The ROM is part of the conventional digital processing system. Thus the phase word p and the frequency word f depend on the particular TV standard being employed such as the NTSC, PAL and so on and have to be programmed by the manufacturer. In any event, both references are well known in the art.

The second adder unit 60 forms the control word st for the digital oscillator 10 by adding the frequency word f and the filtered phase-difference signal. The value of the control word st represents the instantaneous period of the digital oscillator 10. The current control word st formed in the processor device 100 is then applied to the input 10' of the digital oscillator 10. While in the digital oscillator 10, the register word of the accumulator register 11 is increased successively at the clock rate of the clock generator 13. The increase is provided by the current control word and during the time determined from line Z1 (FIG. 2b), whereby the frequency or period T of the digital oscillator 10 is adjusted to the nominal frequency or nominal period determined by the synchronizing pulses S1–S6.

The next adjustment of the actual phase of the digital oscillator 10 to the reference phase does not occur until the digital phase-locked loop 1 is triggered by the synchronizing pulse S2. This will occur at the beginning of line Z2. This next adjustment is performed as described above. Another similar phase adjustment is then performed on the line-periodic synchronizing pulse S3 which occurs at the beginning of line Z3. Thus, the digital phase-locked loop 1 performs the phase adjustment at a first control clock rate determined by the line-periodic synchronizing pulses S1, S2 and S3. This phase adjustment results in the period T of the digital oscillator 10 locking to the nominal period only after a few cycles of the first control clock.

As can be seen in FIG. 2b, the line-periodic synchronizing pulse S3 is followed by a non-line-periodic synchronizing pulse S4 which is shifted by 180°, i.e., by one-half line. In conventional digital phase-locked loops, this non-line-periodic synchronizing pulse S4 interferes with locking of the digital oscillator 10 to the nominal period. This is because the phase adjustment is initiated by all synchronizing pulses as well as non-line periodic synchronizing pulses applied to the digital phase-locked loop.

Therefore, after the digital phase-locked loop 1 has locked onto the nominal period, it is important to adjust the actual phase to the reference phase at a second control clock rate. This allows the non-line-periodic synchronizing pulse S4 to be included in the phase-control process so that the digital oscillator 10 will not be disturbed when it is locked onto the nominal period.

To this end, according to the preferred embodiment of the invention, the processor device 100 derives a signal sequence of one-half line period TD from the DCO output signal. The period TD is exactly one half the period T of the DCO output signal. This signal sequence of one-half line period is then used to determine the phase difference. Thus, after the digital phase-locked loop 1 has locked onto the nominal period, which was determined by the time sequence of the line-periodic synchronizing pulses S1-S3, a change occurs in the second control clock rate which was determined by the line-periodic synchronizing pulses S1-S3 and the non-line-periodic synchronizing pulse S4. The signal sequence with one-half line period is thereafter advantageously used to determine the phase deviation of the digital oscillator, i.e., to calculate the phase-difference signal by comparing the actual phase of the digital oscillator 10 at the instant of triggering (on the occurrence of one of the synchronizing pulses S1-S3 or S4), with the reference phase determined by the phase word p. The phase adjustment performed at the second control clock rate ensures that the half-line displacement of the non-line-periodic synchronizing pulse S4, with respect to the line-periodic synchronizing pulses S1-S3, does not interfere with the operation of the digital phase-locked loop 1. In this mode of operation, the non-line-periodic synchronizing pulse S4 is detected by the phase-measuring circuit of the digital oscillator 10. Another advantage of the digital phase-locked loop 1 constructed in accordance with the invention is that the phase adjustment can now take place twice per line. In this manner, a particularly fast transient response of the digital phase-locked loop 1 is achieved. The difference between the actual phase and the reference phase is only half a line (corresponding to 180°), rather than a full line (corresponding to 360°) and is measured as a linear value (FIG. 2a, line 8). For instance, with the digital phase-locked loop 1 in lock, the phase measurement is performed at twice the horizontal frequency. Since the phase deviation of the digital oscillator 10 is evaluated with one-half line period, the operation of the digital phase-locked loop 1 is stable at two different phases, that of 0° and 180°.

The control unit 20 generates the signal sequence of one-half line period from the DCO output signal simply by disregarding the most significant bit (MSB) N of the DCO output signal. The most significant bit N functions as the sign. The remaining bits N-1, N-2, ..., 1 of the DCO output signal then form the signal sequence of one-half line period. The N-1 bits of the signal sequence are regarded as the sign-magnitude representation of a decimal number, from which the sawtooth waveform of the signal sequence of one-half line period is derived, as shown by numeral 8 in FIG. 2a. By generating the signal sequence of one-half line period, the signal sequence is locked to the DCO output signal.

The bit N of the DCO output signal is transmitted as a DPLL output signal to an output of the digital phase-locked loop 1. The waveform of the DPLL output signal is illustrated in FIG. 2a, numeral 5. As shown in FIG. 2a, the DPLL output signal has the waveform of a line-frequency square-wave signal. It is also possible to generate a DPLL output signal that is more precise than the above-mentioned signal represented only by the bit N of the DCO output signal. Thus, depending on the precision desired, the bit N of the DCO output signal, and also, the bits N-1, etc., are transmitted to the output of the digital phase-locked loop 1.

The DCO output signal is fed to a correction device 110 to generate an address-phase signal which is synchronized with the waveform of the composite color signal FBAS. The correction device 110 receives an address-phase signal from the DCO output signal. The address-phase signal can be used to control the horizontal-frequency video-signal-processing operations. The same control is available even if the time sequence of the line-periodic synchronizing pulses, S1-S3, S5 and S6, is interrupted or shifted by half a line by a non-line-periodic synchronizing pulse S4.

The known horizontal-frequency operations are performed during the processing of the horizontal-frequency composite color signal, e.g., measurement of the synchronizing pulse top DC voltage, measurement of the backporch DC level, gating circuit for the color burst, gating circuit for the video signal proper, gating circuit for the synchronizing pulse, etc. These operations, which are called up or initiated by a suitable keying signal Ki (1-bit control signal), are assigned a defined instant ti or a time window W1, W2, the beginning and end of which are marked by timing marks t1, t2, t3 ..., which are locked to the phase of the respective line. The locking of the timing marks is accomplished by the digital oscillator 10, whose N-bit output signal, in binary representation of the respective timing mark of a line, can be defined by a corresponding numerical value. Thus, the numerical value N1 corresponds to the timing mark t1, the numerical value N2 corresponds to the timing mark t2, etc.

FIGS. 2d and 2e show a schematic representation of the generation of the keying signal Ki by three overlapping time windows W1, W2, W3 and a single keying signal K4. The first line shows the waveform of a composite color signal FBAS in the retrace interval. The next three lines show the time positions of the first, second, and third time windows W1, W2, W3, respectively. The fifth line shows the time position of the keying signal K4, which lasts for only one sampling period. The sloped line 6, shown below the keying signal K4, represents the line-periodic DCO output signal (see FIG. 2C).

For each timing mark t1 through t7, shown in FIG. 2d by broken lines, there is a corresponding fixed numerical value N1 through N7. These numerical values are stored in successively addressable cells of an addressable memory 200 (FIG. 1) in the form of a read-only memory (ROM) or a random-access memory (RAM), as shown in FIG. 2e. Each memory cell contains the numerical value Ni and the respective valid entries of the keying signals K1 through K4. The programmed numerical value Ni represents the next address word NA, at which point the combination of the keying signals K1 through K4 has to be changed. By using a comparator 180 to compare the read-out next address word NA with the most significant bits A of the digital DCO output signal 6, a shift clock g is generated for a cyclic shift register 190. A circulating "1" of the shift clock g functions as a pointer for the successive addresses of the memory 200 (see FIG. 1). The three time windows W1, W2, W3 are formed by the read-out keying entries K1 through K3 and the memory circuits 210, 211, 212. The keying signal K4 functions as a control signal. The three memory circuits 210, 211, 212 that form the three time-window signals W1, W2, W3 are necessary because the keying signals K1-K4 only have a duration of a single sampling period.

The comparator 180 receives the address-phase signal from the DCO output signal of the digital oscillator 10. When comparing the DCO output signal in line 4 of FIG. 2a with the address-phase signal in line 6 of FIG. 2c, it can be seen that the address-phase signal is identical with the DCO output signal during the period determined by lines Z1 and Z2. That is, the DCO output signal and the address-phase signal have identical phase values, whereby synchronism is ensured between the video-signal processing and the waveform of the composite picture signal BAS.

When a non-line-periodic synchronizing pulse S4 occurs, the address phase of the address-phase signal must be corrected in order to ensure synchronism between the horizontal-frequency video-signal-processing operations and the composite picture signal BAS. As shown in FIG. 2c, the correction device 110 must shift the address phase of the address-phase signal by 180°, i.e., by one period TD of the signal sequence of one-half line period. To perform this correction, the correction device 110 includes two XOR gates 150 and 160. A first input 151 of the first XOR gate 150 is supplied with the most significant bit N of the DCO output signal. A second input 152 of the first XOR gate 150 is supplied with the most significant bit N-1 of the control unit output signal. An output 153 of the first XOR gate 150 is connected to a first input 161 of the second XOR gate 160. A second input 162 of the second XOR gate 160 is supplied with the most significant bit N of the digital DCO output signal.

The operation of the correction device 110 is as follows. As shown in FIG. 2a, at the instant when a non-line-periodic synchronizing pulse S4 occurs, the DCO output signal and the signal sequence of one-half line period have different phase values. This is because the signal sequence of one-half line period is locked to the DCO output signal, and therefore, the difference between the phase values is always 180° apart at that instant. Thus, when a non-line-periodic synchronizing pulse S4 occurs, the bit N and the bit N-1 of the DCO output signal are different, because the signal sequence of one-half line period is generated by bits N-1, N-2, . . ., 1 of the DCO output signal, which is determined by bits N, N-1, 1. The result is that unequal binary signals are applied at the two inputs 151, 152 of the first XOR gate 150. Consequently, the output 153 of the first XOR gate 150 is logic "1". In the second XOR gate 160, because of unequal signals being applied to the inputs 161, 162, an inversion of the bit N takes place at the second output 162. The signal appearing at an output 163 takes the place of the bit N of the DCO output signal. Accordingly, the address-phase signal consists of the output signal with the most significant bit from the second XOR gate 160 and bits N-1, N-2 . . . , N-A of the DCO output signal. The inversion of the bit N from the DCO output signal causes a shift of the address phase signal by 180°.

The correction device 110 can detect a non-line-periodic synchronizing pulse S4 from the unequal values of the bit N and the bit N-1 of the DCO output signal and the control unit 20 output signal, respectively, and then perform a correction of the address-phase signal by inverting the bit N. Therefore, synchronism is always ensured between the address-phase signal, which controls the horizontal-frequency video-signal-processing operations, and the luminance signal BAS. This is because the address-phase signal is correlated in a precisely defined and unambiguous manner with the DCO output signal, which, in turn, is synchronized with the composite picture signal BAS.

It will be understood that the embodiment described herein is merely exemplary and that a person skilled in the art may make many variations and modifications without departing from the spirit and scope of the invention. All such modifications and variations are intended to be included within the scope of the invention as defined in the appended claims.

We claim:

1. A digital phased locked loop operative with a television signal comprising:

a controllable digital oscillator for providing at an output a digital output signal of a given period;

a processor coupled to said oscillator for controlling the period of said oscillator;

a sync separator coupled to said processor for providing synchronizing pulses at a nominal period to said processor to enable said processor to compare said pulses with said digital output signal to provide a first control voltage according to the differences in phase between the same;

means for applying said control voltage to said oscillator to lock said oscillator to said nominal period, and means coupled to said digital oscillator to provide at an output a double frequency signal of a second period relatively equal to one half of said nominal period to enable said processor to compare said digital output signal with said double frequency signal to provide a second control voltage for said oscillator, and a second means for applying said second control voltage to said oscillator; and correction means coupled to said digital oscillator for receiving said digital output signal for generating an address phase signal at an output locked to said digital oscillator signal such that in the presence of a non-periodic synchronizing pulse said address phase signal is shifted to compensate for said non-periodic pulse as undesirably affecting said digital oscillator output signal.

2. In a digital phase-locked loop having generating means for generating an output signal of period T, the signal representing an actual phase of the generating means by increasing a register word of length N successively by using a control word (st) which is applied at an input of the digital oscillator and at a predetermined clock rate of a clock generator: and processing means which is provided with the digital oscillator output signal and which performs a phase comparison between the actual phase of the generating means and a reference phase to adjust the period T of the generating means to a nominal period determined by periodically occurring synchronizing pulses, such that the processing means forms a phase-difference signal from the actual phase of the digital oscillator and from the reference phase at a first control clock rate which is determined by the periodically occurring synchronizing pulses, and such that the phase-difference signal is filtered in the processing means and is added to a frequency word (f), the frequency word (f) having a numerical value which represents the nominal period as a function of the length N of the register word of the generating means and the predetermined clock rate of the clock generator, wherein during successive accumulation of the register word by the frequency word (f), the generating means overflows in the nominal period and the control word (st), formed from the frequency word (f) and the phase-difference signal, is applied to the input of the generating means, the improvement therewith including means coupled to the processing means for generating a signal sequence with a one-half line period and for being locked to the digital oscillator output signal, said signal sequence having a period TD equal to one-half the period T of the output signal, such that after the generating means is locked to the nominal period, the processing means performs the phase comparison between the actual and reference phases with the signal sequence being of one-half line period and at a second control clock rate, which is determined by line-periodic synchronizing pulses and a non-line periodic synchronizing pulse, and correcting means for correcting an address-phase signal, and having applied thereto said output signal and said signal sequence, said address-phase signal being locked to the output signal such that in the presence of a non-periodic synchronizing pulse, an address phase of the address-phase signal is shifted by the period TD of the signal sequence having one-half line period with respect to the phase of the output signal.

3. A digital phase-locked loop according to claim 2, wherein the generating means is a periodically overflowing digital oscillator having a modulo adder and an adder, and wherein said modulo adder consists of an accumulator register that stores the register word.

4. A digital phase-locked loop according to claim 2, wherein the processing means includes a control unit, said control unit being triggered by a synchronizing pulse applied to a first input of the processing means and being used to store an instantaneous value of the output signal as the actual phase of the generating means, such that the actual phase is applied to phase comparing means for comparing and forming a phase-difference signal from the actual phase and a phase word (p) representing the reference phase of the generating means at an instant when said control unit is triggered.

5. A digital phase-locked loop according to claim 4, wherein the processing means includes first adding means for adding the phase-difference signal formed in the phase comparing means to a signal applied to a second input of the processing means, said first adding means also serving to fine-control the digital phase-locked loop.

6. A digital phase-locked loop according to claim 5, wherein the phase-difference signal is applied to filtering means for filtering the phase-difference signal, said filtering means including a loop filter unit, and wherein the phase-difference signal is then applied to second adding means for adding the filtered phase-difference signal and the frequency word (f) to form the control word (st) of the generating means.

7. A digital phase-locked loop according to claim 2, further comprising programming means, said programming means including a program-controlled microcomputer and being connected to the processing means for programming processing operations on the output signal in each functional unit of the processing means.

8. A digital phase-locked loop according to claim 7, wherein said each functional unit is implemented as hard-wired logic of an integrated circuit.

9. A digital phase-locked loop according to claim 7, wherein said each functional unit is implemented as discrete components.

10. A digital phase-locked loop according to claim 2, wherein said correcting means includes a first XOR gate having a first input supplied with a most significant bit N of the output signal and a second input supplied with a most significant bit N-1 of the signal sequence; and a second XOR gate having another first input and another second input, wherein an output of said first XOR gate is coupled to said another first input of said second XOR gate and said another second input of said second XOR gate is supplied with said most significant bit N of the output signal.

11. A digital phase-locked loop according to claim 2, wherein an output of said address-phase signal that is formed in said correcting means is fed to a comparing means for comparing a current address phase of the address-phase signal with a stored address word NA having an address in a memory retaining means, said comparing means also driving a cyclic shift register with shift clock (g) for being generated when the current address phase is synchronized with the address word NA stored in said memory retaining means.

12. A digital phase-locked loop according to claim 2, wherein the address-phase signal is used in a horizontal deflection circuit of a television receiver.

13. A digital phase-lock loop according to claim 2, wherein the address-phase signal is used in a horizontal sync circuit of a video recorder.

14. A digital phase-locked loop according to claim 13, wherein the address-phase signal is used to implement special control features of the video recorder during playback.

* * * * *